(12) United States Patent
Johnson, Jr. et al.

(10) Patent No.: US 7,040,920 B2
(45) Date of Patent: May 9, 2006

(54) CONNECTION SYSTEMS AND METHODS FOR UTILITY METERS

(75) Inventors: Richard R. Johnson, Jr., Surrey (CA); Thanh Le, Ferndale, WA (US); David A. Barany, Blaine, WA (US)

(73) Assignee: Alpha Technologies, Inc., Bellingham, WA (US)

( * ) Notice: Subject to any disclaimer, the term of this patent is extended or adjusted under 35 U.S.C. 154(b) by 0 days.

(21) Appl. No.: 10/863,121

(22) Filed: Jun. 7, 2004

(65) Prior Publication Data

US 2005/0164546 A1    Jul. 28, 2005

Related U.S. Application Data

(60) Provisional application No. 60/476,479, filed on Jun. 6, 2003.

(51) Int. Cl.
*H01R 33/945* (2006.01)

(52) U.S. Cl. .................................. 439/517; 439/146

(58) Field of Classification Search ............... 439/517, 439/146, 508; 361/662, 660–672
See application file for complete search history.

(56) References Cited

U.S. PATENT DOCUMENTS

| | | |
|---|---|---|
| 2,606,232 A | 8/1952 | St. John |
| 3,067,362 A | 12/1962 | Patton |
| 3,549,951 A | 12/1970 | Plummer |
| 3,643,209 A | 2/1972 | Coston |
| 3,714,516 A | 1/1973 | Howe |
| 4,314,738 A | 2/1982 | Davis et al. |
| 4,977,482 A | 12/1990 | Langdon et al. |
| 5,334,057 A | 8/1994 | Blackwell |
| 6,074,246 A | 6/2000 | Seefeldt et al. |
| 6,589,072 B1 | 7/2003 | Robinson et al. |
| 6,592,399 B1 | 7/2003 | Robinson et al. |
| 6,663,405 B1 | 12/2003 | Robinson et al. |
| 6,663,422 B1 | 12/2003 | Robinson |
| 6,752,652 B1 | 6/2004 | Robinson |

*Primary Examiner*—Ross Gushi
(74) *Attorney, Agent, or Firm*—Michael R. Schacht; Schacht Law Office, Inc.

(57) ABSTRACT

A connection system for allowing access to a primary power signal flowing through a utility meter. The connection system comprises a collar assembly, an adapter assembly, and adapter electronics. The collar assembly comprises a collar housing adapted to engage the wall box and the meter assembly, a plurality of main terminals, a plurality of secondary terminals. The adapter assembly comprises an adapter housing and a plurality of adapter contacts. The adapter housing is sized and dimensioned to be arranged in an engaged position relative to the collar housing. The adapter contacts engage the secondary contacts when the adapter housing is in the engaged position. The adapter electronics are contained within the adapter housing and are electrically connected to the adapter contacts.

29 Claims, 15 Drawing Sheets

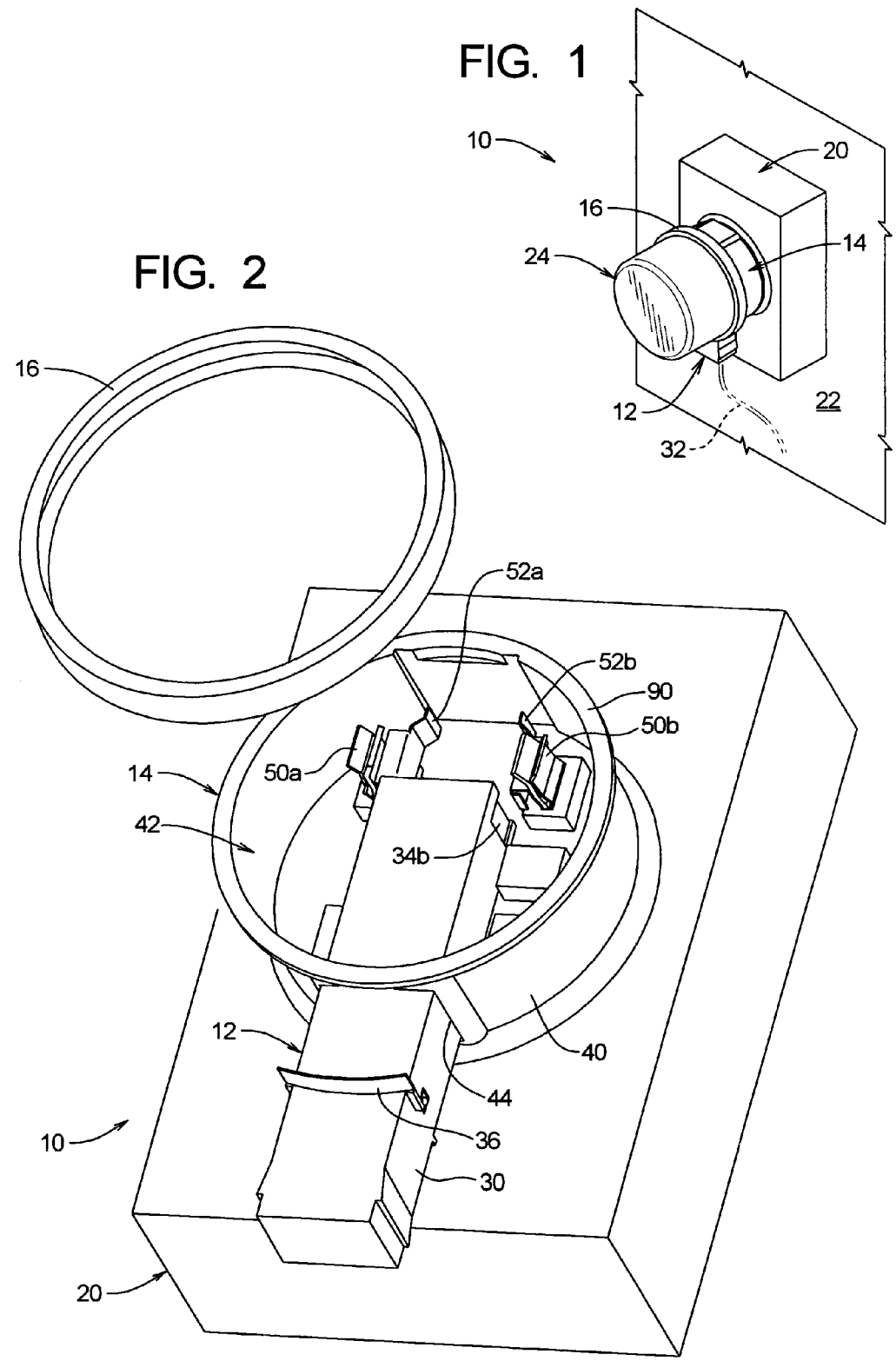

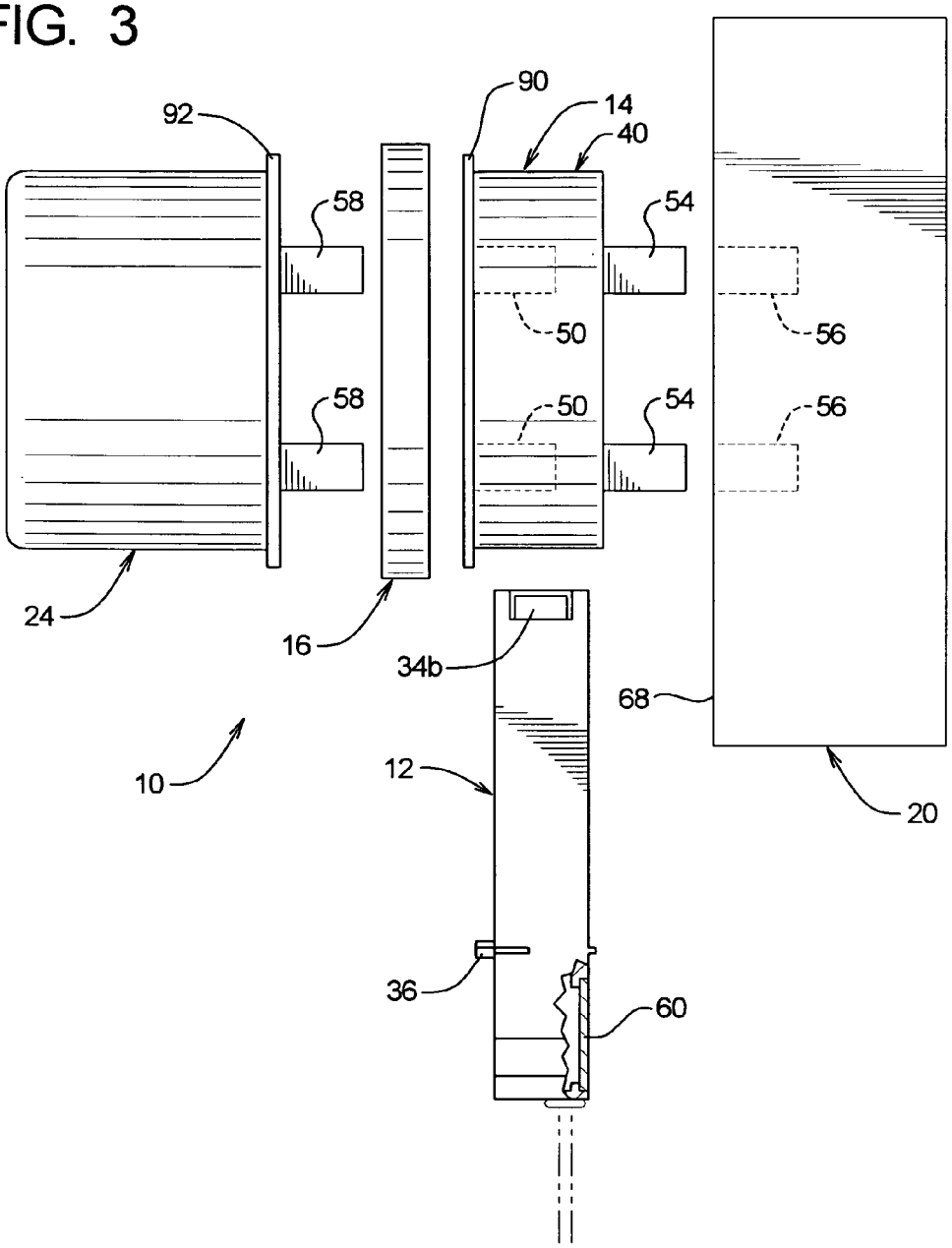

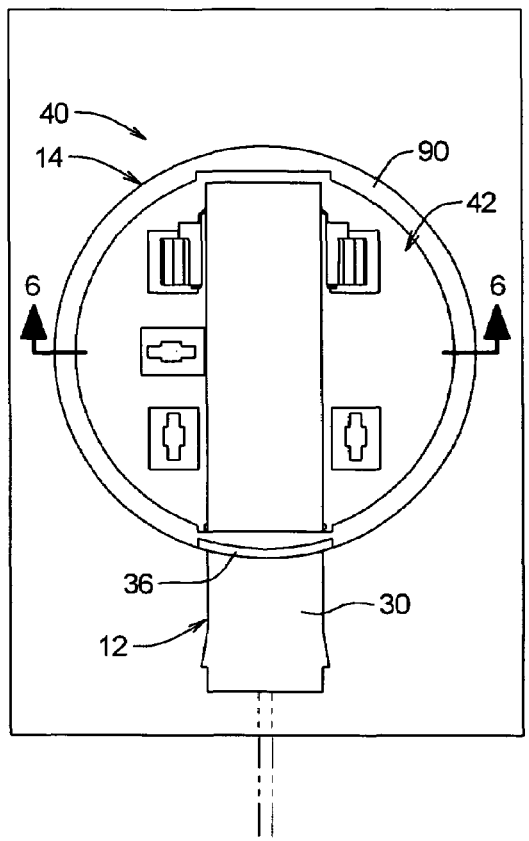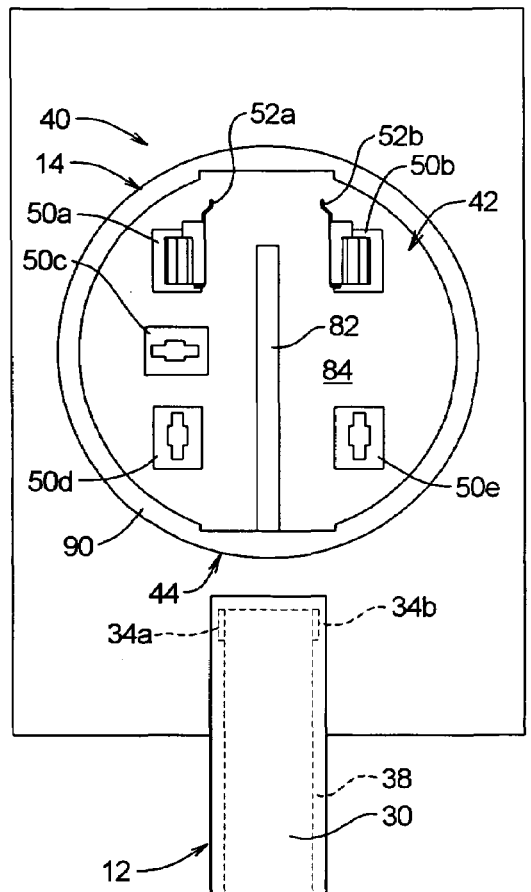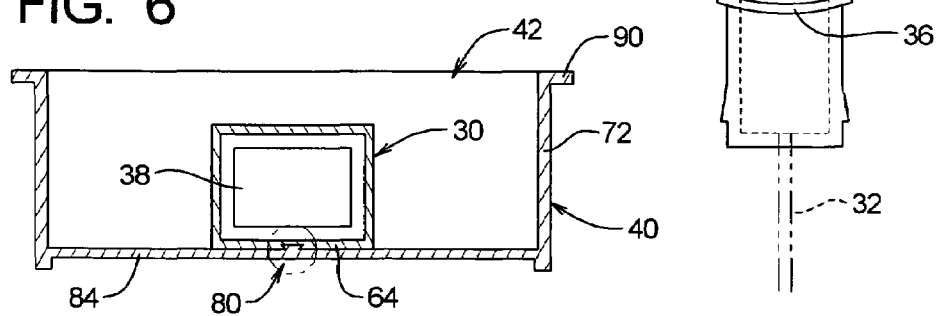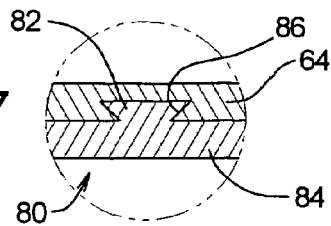

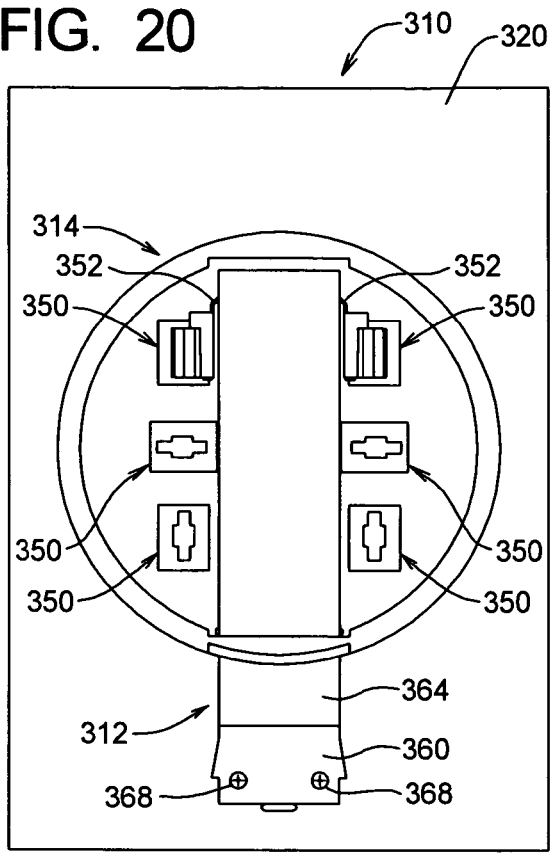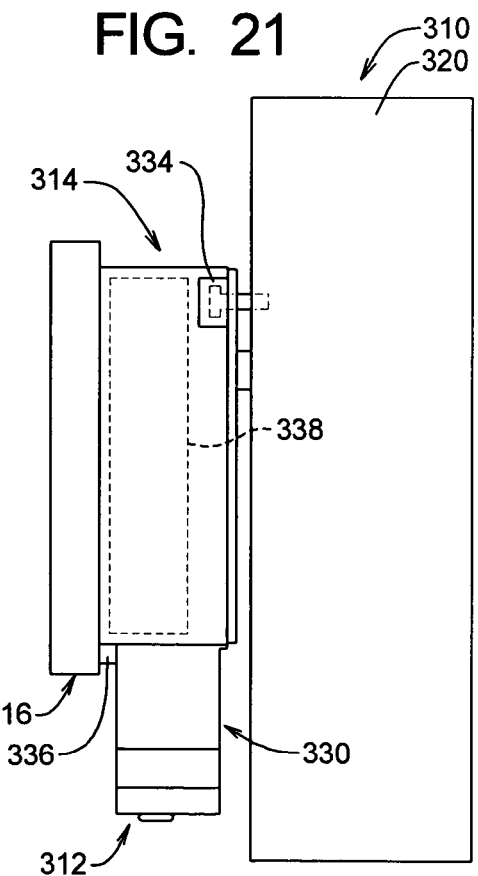

CONNECTION SYSTEMS AND METHODS FOR UTILITY METERS

RELATED APPLICATIONS

This application claims priority of U.S. Provisional Patent Application Ser. No. 60/476,479 filed Jun. 6, 2003.

FIELD OF THE INVENTION

The present invention relates to systems and methods for connecting to utility meters and, more specifically, to such systems and methods that allow an electrical connection to be established on either the utility side or the user side of a utility power meter.

BACKGROUND OF THE INVENTION

Electrical power distribution systems have long used power meter assemblies located at a subscriber's residence to measure the amount of power consumed at the residence. A power meter assembly comprises a wall box and a meter assembly. The wall box is permanently attached to a structural surface at the residence, and the meter assembly is secured to the wall box. The wall box is electrically connected to the power mains within the residence.

The wall box comprises a set of terminals, and the meter assembly comprises prongs that are sized and dimensioned to be received by the wall box terminals when the meter assembly is secured to the wall box. Electrical power supplied to the residence by the utility thus flows through the meter assembly.

During normal use, the collar assembly is sealed to prevent tampering with the meter assembly. To obtain power from the outside of the residence, a utility service technician must remove the meter assembly, thereby disconnecting power to the residence. The need exists for connection systems and methods for utility meters that allow access to the utility power circuit at the meter assembly without removing the meter assembly.

SUMMARY OF THE INVENTION

A connection system for allowing access to a primary power signal flowing through a utility meter. The connection system comprises a collar assembly, an adapter assembly, and adapter electronics. The collar assembly comprises a collar housing adapted to engage the wall box and the meter assembly, a plurality of main terminals, a plurality of secondary terminals. The adapter assembly comprises an adapter housing and a plurality of adapter contacts. The adapter housing is sized and dimensioned to be arranged in an engaged position relative to the collar housing. The adapter contacts engage the secondary contacts when the adapter housing is in the engaged position. The adapter electronics are contained within the adapter housing and are electrically connected to the adapter contacts.

BRIEF DESCRIPTION THE DRAWING

FIG. 1 is a perspective view of the connection system of the present invention being used to connect a meter assembly to a wall box;

FIG. 2 is a perspective view of an adapter assembly, collar assembly, and lock ring of the connection system of FIG. 1;

FIG. 3 is a side elevation exploded view depicting the connection system, meter assembly, and wall box of FIGS. 1 and 2;

FIGS. 4 and 5 depict the adapter assembly in an engaged position and pre-engaged position, respectively, with respect to the collar assembly;

FIG. 6 is a cutaway view taken along lines 6—6 of FIG. 4;

FIG. 7 is an enlarged view of a portion of FIG. 6;

FIG. 20 is a front elevation view of another embodiment of a meter connection system of the present invention;

FIG. 21 is a side elevation view of the meter connection system of FIG. 20;

DETAILED DESCRIPTION OF THE INVENTION

Figure 8:
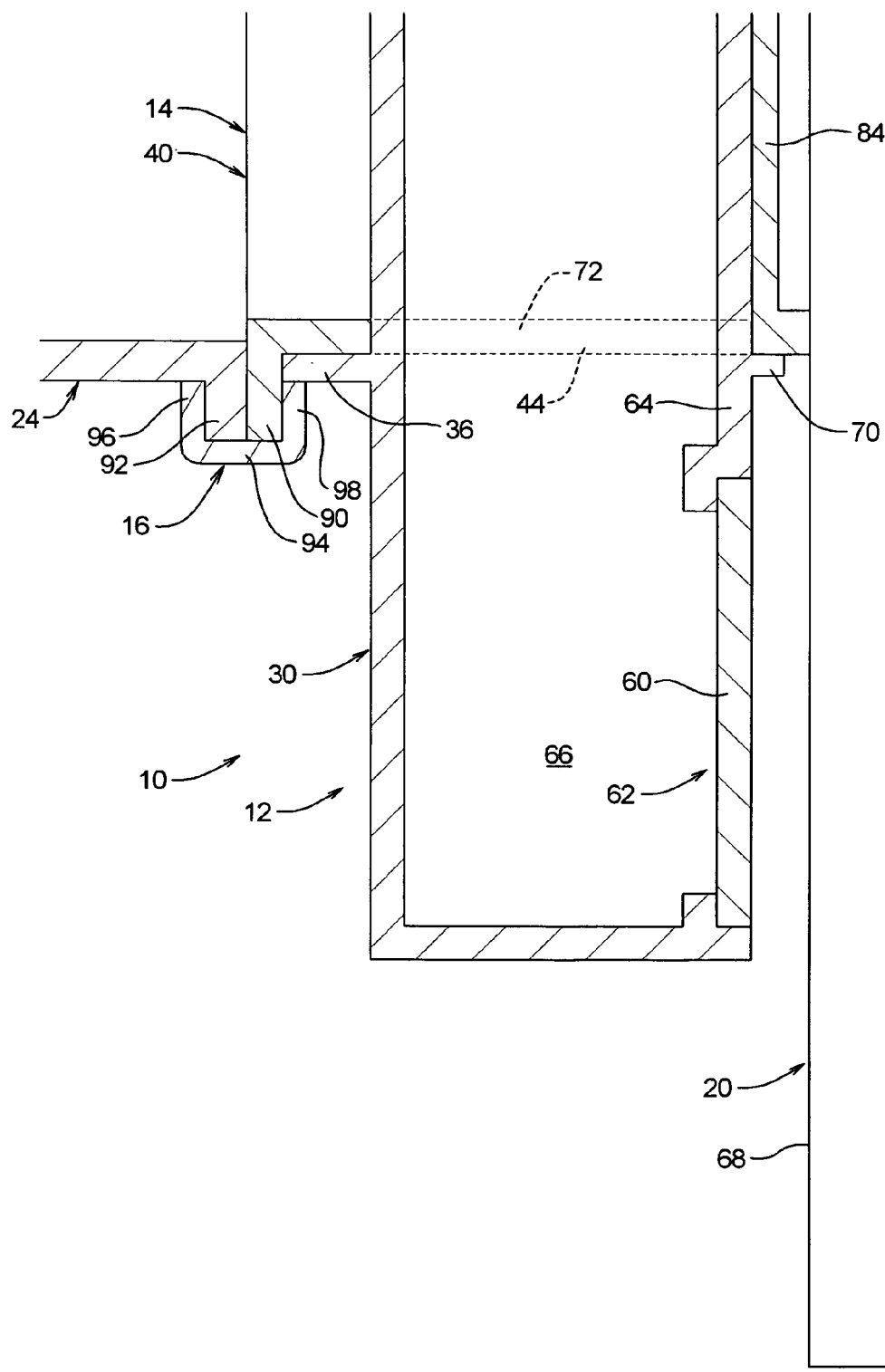
FIG. 8 is a partial, side elevation, cut-away view depicting the connection of the meter assembly and adapter assembly to the collar assembly.

Referring initially to FIG. 1 of the drawing, depicted therein is a meter connection system 10 constructed in accordance with, and embodying, the principles of the present invention. The meter connection system 10 comprises an adapter assembly 12, a collar assembly 14, and an optional lock ring 16.

The meter connection system 10 is of particular significance when used with a wall box 20 secured to an exterior surface 22 of a building served by a utility company. As is conventional, the wall box 20 establishes a connection point between the utility power distribution system and the user power system within the building defining the exterior surface 22. The utility company typically connects a meter assembly 24 to the wall box 20 to measure power consumption by the user.

The utility company usually has access to the wall box 20 and meter assembly 24 but not necessarily to the interior of the building defining the exterior surface 22. Also, the electrical connection established between the wall box 20 and meter assembly 24 causes power to the user power system to be disrupted when the meter assembly 24 is removed from the wall box 20.

The configurations of the wall box 20 and meter assembly 24 can vary by manufacturer and/or utility company but, from the perspective of the present invention, may be considered conventional. The wall box 20 and meter assembly 24 will not be described herein beyond what is necessary for a complete understanding of the construction and operation of the meter connection system 10 of the present invention.

The adapter assembly 12 comprises an adapter housing 30 (FIG. 2). Illustrated by broken lines in FIG. 1 is an optional adapter cable 32 that will be described in further detail below. The adapter assembly 12 further comprises a plurality of adapter contacts 34; example adapter contacts 34a and 34b are shown by broken lines in FIG. 5. A lock projection 36 is formed on the adapter housing 30.

As further shown by broken lines in FIG. 5, the adapter housing 30 further comprises adapter electronics 38 operatively connected to the adapter contacts 34a and 34b and to the adapter cable 32. As will be described in further detail below, the adapter electronics 38 can taken many different forms, and the present invention is not limited to any particular form of adapter electronics. In general, as will be described below, the adapter electronics 38 condition or regulate the utility or primary power signal, form part of an uninterruptible power supply, or in some way generate a modified signal based on the utility or primary power signal.

The collar assembly 14 comprises a collar housing 40 defining a main opening 42 and an adapter opening 44. As shown in FIGS. 2, 4, and 5, the collar assembly 14 further comprises a plurality of main terminals 50 and a plurality of secondary terminals 52.

FIGS. 4 and 5 illustrate that the example collar assembly 14 comprises five main terminals 50a, 50b, 50c, 50d, and 50e and a pair of secondary terminals 52a and 52b. The main terminals 50a–e may be conventional; however, the example secondary terminals 52a and 52b are formed integrally with the main terminals 50a and 50b. As an alternative, the secondary terminals 52a and 52b may be located remote from, but electrically connected to, the main terminals 50a and 50b. For clarity in FIGS. 4 and 5, the terminals 50c, 50d, and 50e are represented by terminal mounts into which terminal assemblies are inserted.

FIG. 3 shows that the collar assembly 14 further comprises a plurality of collar prongs 54. The collar prongs 54 are sized, dimensioned, and located to mate with box terminals 56 within the wall box 20. Similar meter prongs 58 are formed on the meter assembly 24 to engage two or more of the main terminals 50 of the collar assembly 14. The meter prongs 58, the main terminals 50, the collar prongs 54, and the box terminals 56 are or may be conventional and will not be described herein beyond what is necessary for a complete understanding of the present invention.

The meter prongs 58 are sized, dimensioned, and located to mate with the box terminals 56 within the wall box 20. Accordingly, the meter assembly 24 may be directly connected to the wall box 20. However, as shown in FIG. 3, the collar assembly 14 is placed between the meter assembly 24 and the wall box 20 when the meter connection system 10 is used. From an electrical perspective, the collar assembly 14 passes power between the wall box 20 and the meter assembly 24. In addition, as will be described in further detail below, the collar assembly 14 allows components within the adapter assembly 12 to access the power on the utility side and/or the user side of the meter assembly 24.

In use, the collar assembly 14 is connected to the wall box 20 such that the box terminals 56 receive the collar prongs 54. The meter assembly 24 is then connected to the collar assembly 14 such that the main terminals 50 receive the meter prongs 58. At this point, power may flow normally from the utility side to the user side, and the meter assembly 24 will function normally to measure power consumption by the user. Optionally, the lock ring 16 is then used to lock the meter assembly 24 onto the collar assembly 14.

The adapter assembly 12 may at this point be inserted through the adapter opening 44 in the collar housing 40 (FIG. 5) such that the first and second secondary terminals 52a and 52b engage the adapter contacts 34 in an engaged position (FIG. 4). As will be described in further detail below, at this point power may flow to loads within the adapter housing 30 or, through the adapter cable 32, to loads located remote from the meter connection system 10. Removal of the adapter assembly 12 does not necessarily disrupt power to the user side of the meter assembly 24.

As is clearly depicted in FIGS. 2, 4, and 5, the secondary contacts 52a and 52b oppose each other, and the adapter contacts 34a and 34b face outwardly towards the secondary contacts 52a and 52b, respectively. The secondary contacts 52a and 52b are spring-loaded to apply a biasing force against the adapter contacts 34a and 34b. When the adapter housing 30 moves between the secondary contacts 52a and 52b, the biasing forces applied by the secondary contacts 52a and 52b on the adapter contacts 34a and 34b pinch the adapter housing 30. The collar assembly 14 thus secures the adapter assembly 12 in the engaged position shown in FIG. 4.

Referring now to FIGS. 3 and 8, depicted therein is an optional access plate 60 adapted to cover an access opening 62 in a rear wall 64 of the adapter housing 30. When the access plate 60 is removed, an adapter chamber 66 defined by the adapter housing 30 may be accessed through the access opening 62. In addition, as shown in FIG. 8, when the collar assembly 14 is connected to the wall box 20 and the adapter assembly 12 is connected to the collar assembly 14, the adapter housing rear wall 64 is closely adjacent to a front wall 68 of the wall box 20. The close proximity of the housing rear wall 64 to the wall box front wall 68 limits access to the access plate 60.

FIG. 8 illustrates that, in addition to the lock projection 36, an optional stop projection 70 may be formed on the rear wall 64 of the adapter housing 30. The stop projection 70 is located such that the stop projection 70 engages an annular wall 72 of the collar housing 40 when the adapter assembly 12 is in the engaged position.

Referring now to FIGS. 6 and 7, depicted therein is an optional guide system 80 that guides the adapter assembly 12 into the engaged position shown in FIG. 4. The example guide system 80 comprises an alignment projection 82 formed on a rear wall 80 of the collar housing 40. A complementary alignment groove 84 is formed on the adapter housing rear wall 64. Typically, the meter assembly 24 blocks the user's view of the secondary terminals, and the guide system 80 ensures that the adapter contacts 34 come into contact with the secondary terminals 52. The guide system 80 is not required to practice the present invention, and the guide system 80 may be implemented in forms other than those shown and described herein.

As generally described above, the lock ring 16 is optionally used to lock the meter assembly 24 onto the collar assembly 14 to inhibit removal of and/or tampering with the meter assembly 24. In particular, a collar flange 90 is formed on the collar housing 40, and a meter flange 92 is formed on the meter assembly 24. The collar flange 90 and meter flange 92 are sized and dimensioned such that the flanges 90 and 92 abut each other in a coupling plane when the meter assembly 24 is plugged into the collar assembly 14.

The lock ring 16 defines an annular outer wall 94. Extending from the outer wall 94 are first and second retaining walls 96 and 98. The outer wall 94 is sized and dimensioned such that it snugly fits around the abutting collar and meter flanges 90 and 92 with the retaining walls 96 and 98 extending radially inwardly along the flanges 90 and 92. Typically, the diameter of the lock ring 16 may be changed to allow it to be placed over the flanges 90 and 92 as shown in FIG. 8.

A lock or other security device may be used to prevent or identify tampering with the lock ring 16. In addition, the lock ring 16 itself may be eliminated in favor of directly locking the flanges 90 and 92 together.

FIG. 8 further shows that, in the example system 10, with the lock ring 16 mounted on the flanges 90 and 92, the lock ring 16 also extends over the lock projection 36. If someone attempts to remove the adapter assembly 12, the lock projection 36 will engage the lock ring 16. The lock ring 16 thus not only limits tampering with the meter assembly 24, it also limits tampering with the adapter assembly 12. If the flanges 90 and 92 are directly fastened together, a lock or tamper proof device may be located adjacent to the adapter assembly 12 to inhibit movement of the adapter assembly 12 relative to the collar assembly 14.

Referring now to FIGS. 9–18, depicted therein are a number of example embodiments of systems using a meter connection system such as the meter connection system 10 described herein. In all of these FIGS. 9–18, a solid black line 100 indicates an exterior wall of a building. Items located to the left of the line 100 are inside the building, and items located to the right of the line 100 are outside of the building.

Figure 9:
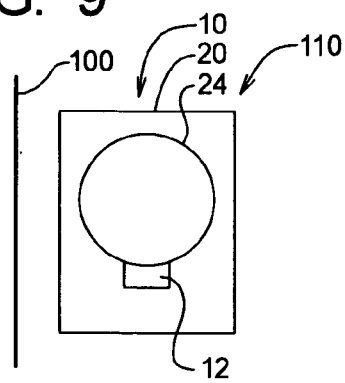
FIGS. 9–19 are block diagrams depicting example environments in which the meter connection system of FIG. 1 may be used.

As shown in FIG. 9, the meter connection system 10 may be used in a standalone configuration 110 without any ancillary modules connected thereto. In the standalone configuration 110, the adapter cable is not used. For example, the adapter electronics 38 may take the form of a surge suppressor, and the standalone configuration 110 could be configured such that the adapter contacts 34, terminals 50 and 52, and prongs 54 and 56 connect the surge suppressor between the utility side and the user side of the meter assembly 24.

Figure 10:
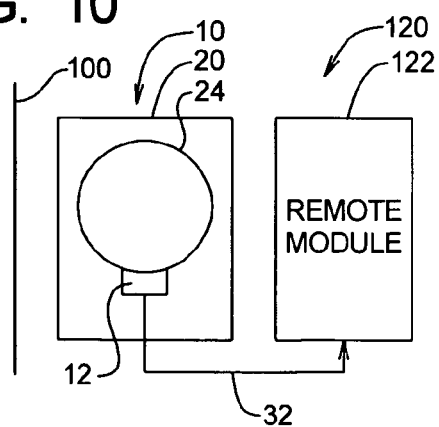

FIG. 10 illustrates the use of the meter connection system 10 in a basic powering configuration 120. In the basic powering configuration 120, the adapter cable 32 is used to connect the adapter electronics 38, in the form of a power converter, within the adapter assembly 12 to a remote module 122. The remote module 122 contains electronics such as telecommunications equipment. The power converter in the adapter assembly 12 is adapted to be connected to the secondary terminals 52 to convert the utility or primary power signal into a secondary power supply signal appropriate for the powering of the electronics within remote module 122. A power converter is or may be conventional, is not per se part of the present invention, and will not be described herein in detail.

Figure 11:
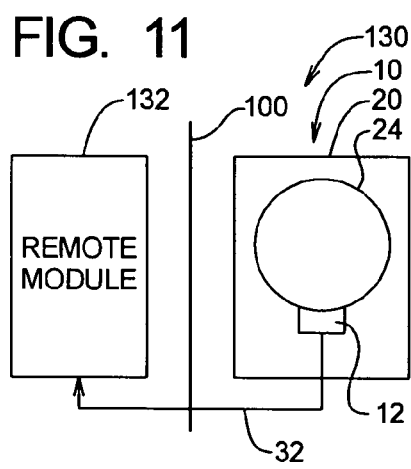

FIG. 11 illustrates the use of the meter connection system 10 in an alternative basic powering configuration 130. The alternative basic powering configuration 130 is the same as the basic configuration described above except that the adapter cable 32 extends through the wall 100 to a remote module 132 within the building defining the wall 100.

Figure 12:
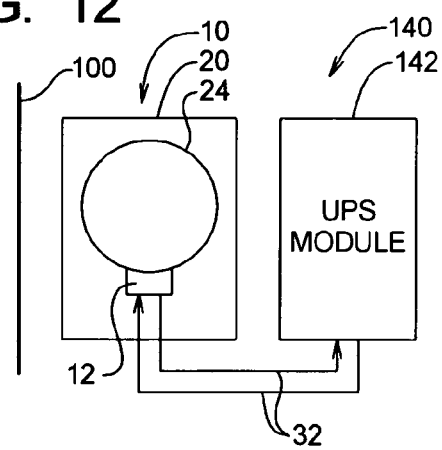

FIG. 12 illustrates the use of the meter connection system 10 in a UPS powering configuration 140. In the UPS powering configuration 140, the adapter electronics 38 take the form of a power converter, and the adapter cable 32 connects the power converter to a UPS module 142. The UPS module 142 contains batteries and other electronics that generate a standby or secondary power signal for use by the user power system within the subscriber's residence should the utility or primary power signal fail to meet predetermined requirements.

Figure 13:
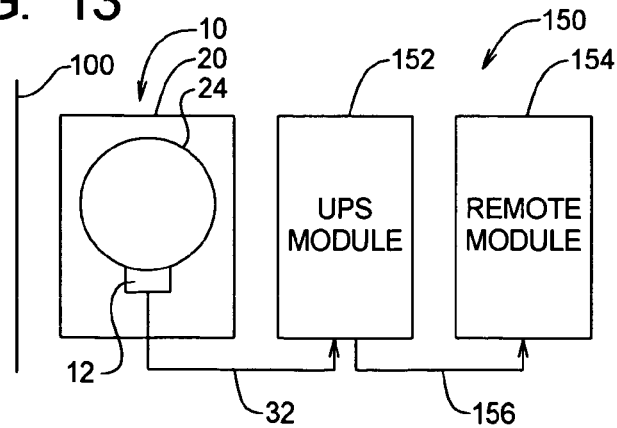

FIG. 13 illustrates the use of the meter connection system 10 in a first alternative UPS powering configuration 150. In the UPS powering configuration 150, the adapter cable 32 is used to connect a power converter (not shown) within the adapter assembly 12 to a UPS module 152. The UPS module 152 contains batteries and other electronics that allow the generation of a standby power signal for use by electronics within a remote module 154 should the utility or primary power signal fall outside of predetermined parameters. A secondary cable 156 connects the UPS module 152 and the remote module 154.

Figure 14:
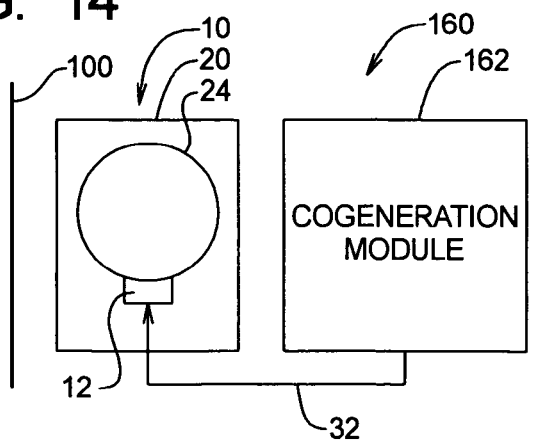

FIG. 14 illustrates the use of the meter connection system 10 in a cogeneration configuration 160. In the cogeneration configuration 160, the adapter cable 32 is used to connect a cogeneration module 162 to the adapter assembly 12. One use of the cogeneration configuration 160 is for the cogeneration module 162 to generate an alternative secondary or standby power signal for providing power to the user power system. Another use is for the cogeneration module 162 to generate an alternative secondary or standby power signal for selling power back to the utility company through the utility power system. The adapter electronics 38 within the adapter assembly 12 govern the power distribution from the cogeneration module 162 to the user power system and/or the utility power system.

Figure 15:
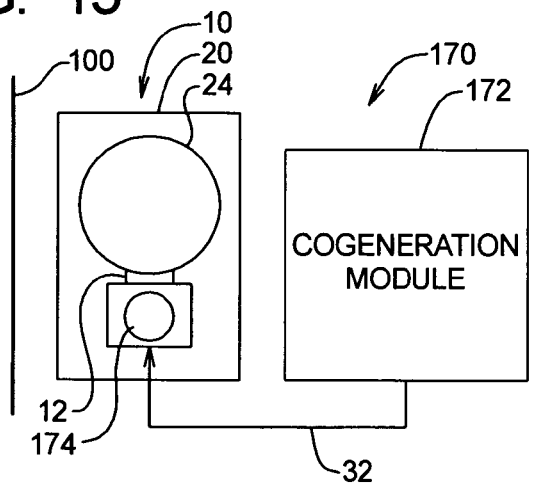

FIG. 15 illustrates the use of the meter connection system 10 in a first alternative cogeneration configuration 170. In the cogeneration configuration 170, the adapter cable 32 is used to connect a cogeneration module 172 to the adapter assembly 12. The adapter assembly 12 contains a cogeneration meter 174 that measures the amount of power generated by the cogeneration module 172. The readings from the meters 24 and 174 can be used to credit the user as necessary for the power created by the cogeneration module 172.

Figure 16:
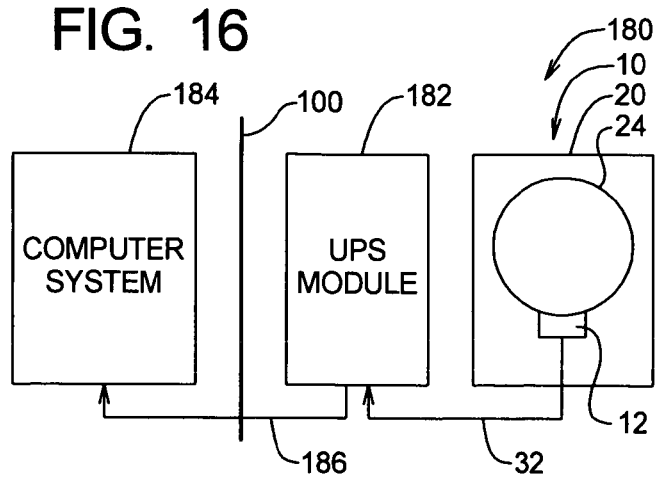

FIG. 16 illustrates the use of the meter connection system 10 in a second alternative UPS powering configuration 180. In the UPS powering configuration 180, the adapter electronics 38 take the form of a power converter, and the adapter cable 32 is used to connect the power to a UPS module 182. The UPS module 182 contains batteries and other electronics that allow the generation of a standby or secondary power signal for use by remote module 184 located within building defining the wall 100. A secondary cable 186 connects the UPS module 182 and the remote module 184. The UPS module 182 generates the secondary or standby power signal for the remote module 184 should the utility or primary power signal fall outside of predetermined parameters. The second alternative UPS power configuration 180 allows only selected electronics within the building, such as a computer system as shown in FIG. 16, to be powered should the utility or primary power signal be inadequate.

Figure 17:
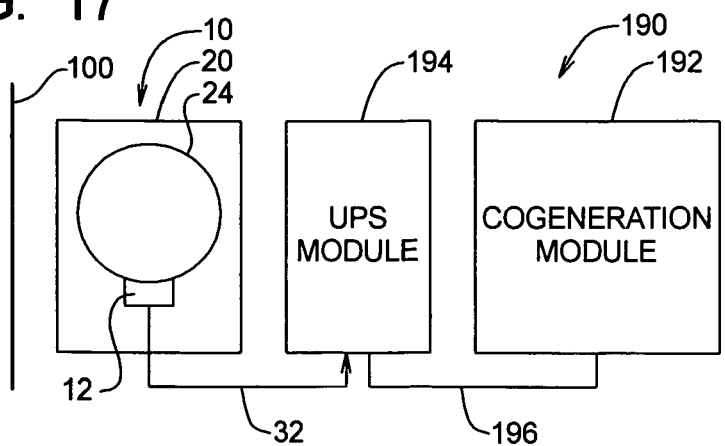

FIG. 17 illustrates the use of the meter connection system 10 in a third alternative cogeneration configuration 190. In the cogeneration configuration 190, the adapter cable 32 is used to connect a cogeneration module 192 to a UPS module 194. A secondary cable 196 connects the cogeneration module 192 to the UPS module 194. The UPS module 192 contains batteries and other electronics that allow the generation of a standby or secondary power signal for use when the utility or primary power signal generated by the cogeneration module falls outside predetermined parameters.

Figure 18:
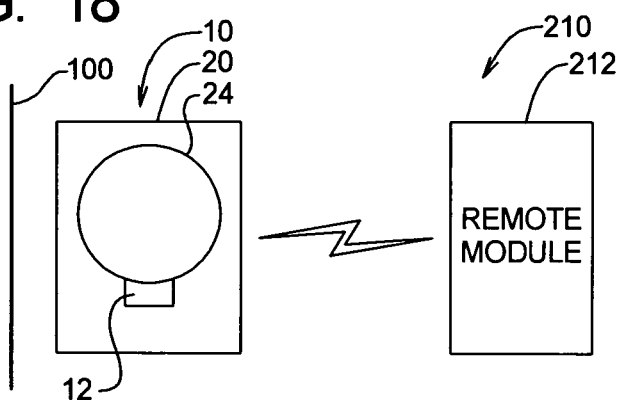

FIG. 18 illustrates that the meter connection system 10 may be used in a second standalone configuration 210 without any ancillary modules directly connected thereto. In the standalone configuration 210, the adapter electronics 38 take the form of a transmitter system and the adapter cable is not used. The transmitter system forms a wireless connection with a remote module 212. Data generated by the meter assembly 24 may thus be transmitted to remote module 212.

In addition, the adapter electronics 38 may form a transceiver, and data may also be transmitted from the remote module 212 to the meter assembly 24. The remote module 212 may fixed relative to the wall box 20 or may be a portable device, such as a wireless computing device adapted to be carried by a meter reader, capable of downloading, storing, and/or retransmitting meter data transmitted from the meter assembly 24.

Figure 19:
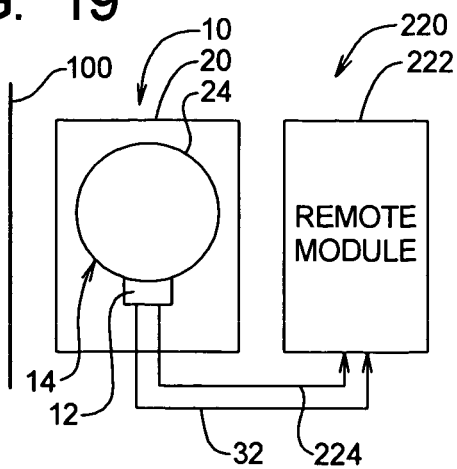

FIG. 19 illustrates the use of the meter connection system 10 in another alternative powering configuration 220. In the powering configuration 220, the adapter electronics 38 take the form of a power converter, and the adapter cable 32 is used to connect the power converter to a remote module 222. The remote module 122 contains telecommunications equipment. The power converter in the adapter assembly 12 is adapted to be connected to the secondary terminals 52 to convert the utility or primary power signal into a secondary or standby power supply signal appropriate for the powering the telecommunications equipment within remote module 122. In addition, a second cable 224 carries data from the meter assembly 24 to the telecommunications equipment within the remote module 222. This data can be carried by the communications system to an appropriate location such as the billing unit of a utility company.

Referring now to FIGS. 20–27, depicted therein is yet another example of a meter connection system 310 constructed in accordance with, and embodying, the principles of the present invention. The meter connection system 310 comprises an adapter assembly 312, a collar assembly 314, and an optional lock ring 316.

The meter connection system 310 is of particular significance when used with a wall box 320 secured to an exterior surface of a building served by a utility company.

The adapter assembly 312 comprises an adapter housing 330. The adapter assembly 312 further comprises a plurality of contacts 334. A lock projection 336 is formed on the adapter housing 330. Adapter electronics 338 (FIG. 21) are arranged within the adapter housing 330. Like the adapter electronics 38 discussed above, the adapter electronics 338 may take different forms depending on the environment in which the connection system 310 is to be used.

The collar assembly 314 comprises a collar housing 340 defining a main opening 342 and an adapter opening 344. The collar assembly 314 further comprises a plurality of main terminals 350 and a plurality of secondary terminals 352. For clarity in FIGS. 20 and 25, certain of the terminals 350 are represented by terminal mounts into which the terminals are inserted.

In use, the collar assembly 314 is mechanically and electrically connected to the wall box 320 as generally described above. The meter assembly 324 is then mechanically and electrically connected to the collar assembly 314. At this point, a utility or primary power signal may flow normally from the utility side to the user side, and the meter assembly (not shown) will function normally to measure power consumption by the user. Optionally, the lock ring 316 is used to lock the meter assembly onto the collar assembly 314.

The adapter assembly 312 may then be inserted into the collar housing 340. At this point the utility or primary power signal may flow to loads within the adapter housing 330 or to loads located remote from the meter connection system 310. Removal of the adapter assembly 312 does not necessarily disrupt power to the user side of the meter assembly.

As shown in FIG. 20, an optional access plate 360 is adapted to cover an access opening in a front wall 364 of the adapter housing 330. When the access plate 360 is removed, an adapter chamber defined by the adapter housing 330 may be accessed. Tamper resistant screws 368 are used limit access to the adapter chamber.

Figure 22:
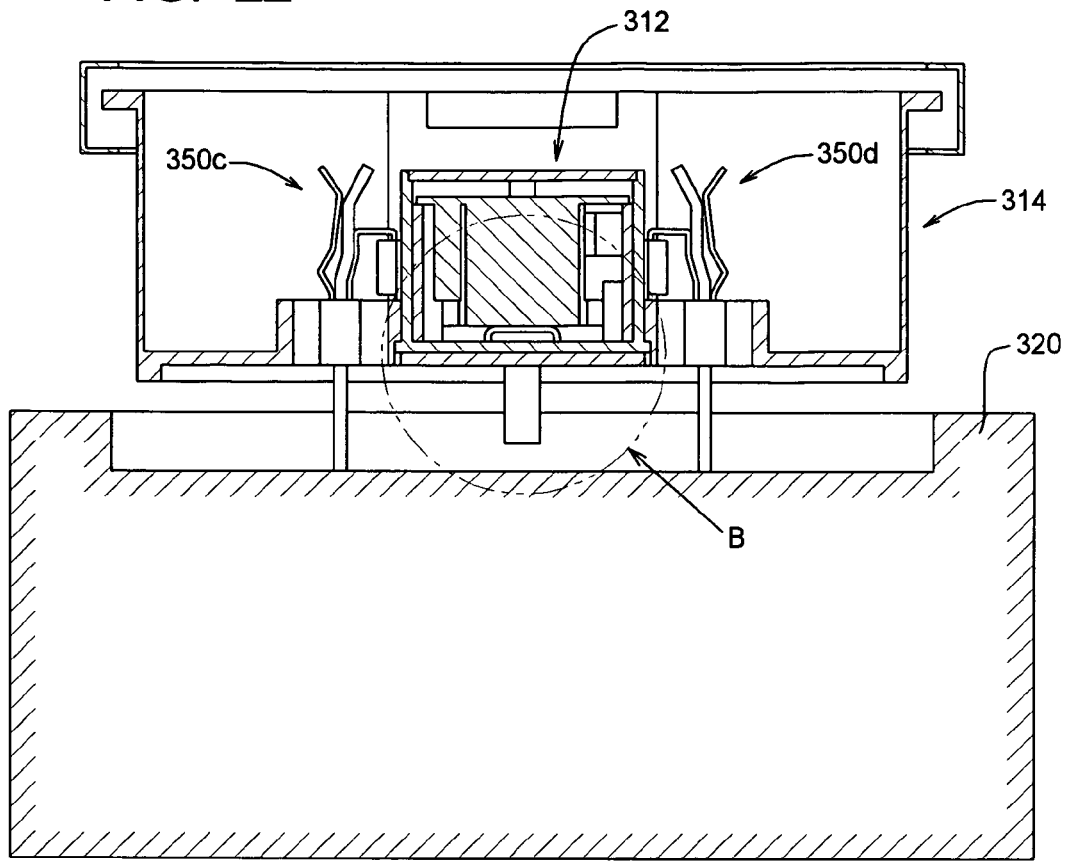
FIG. 22 is a bottom section view of the meter connection system of FIG. 20.
Figure 23:
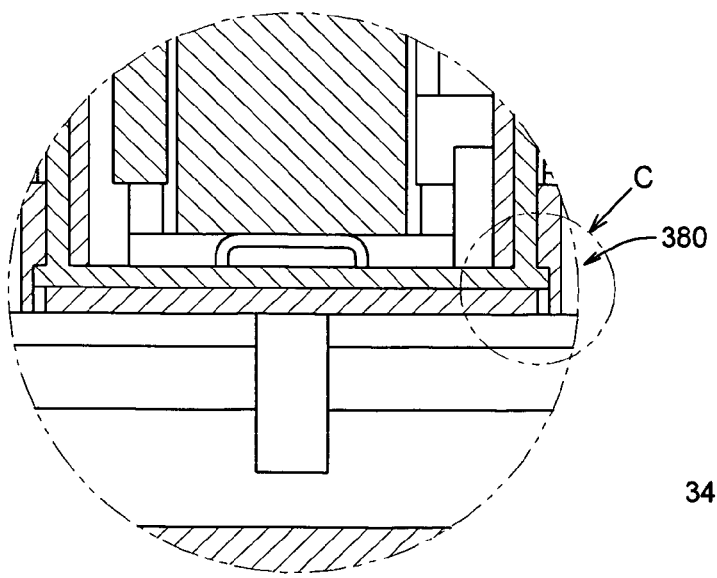
FIG. 23 is a detail section view of the area identified by reference character B in FIG. 22.
Figure 24:
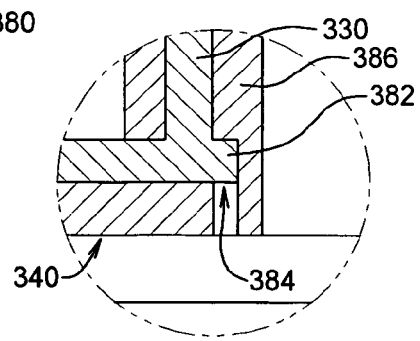
FIG. 24 is a detail section view of the area identified by reference character C in FIG. 23.
Figure 25:
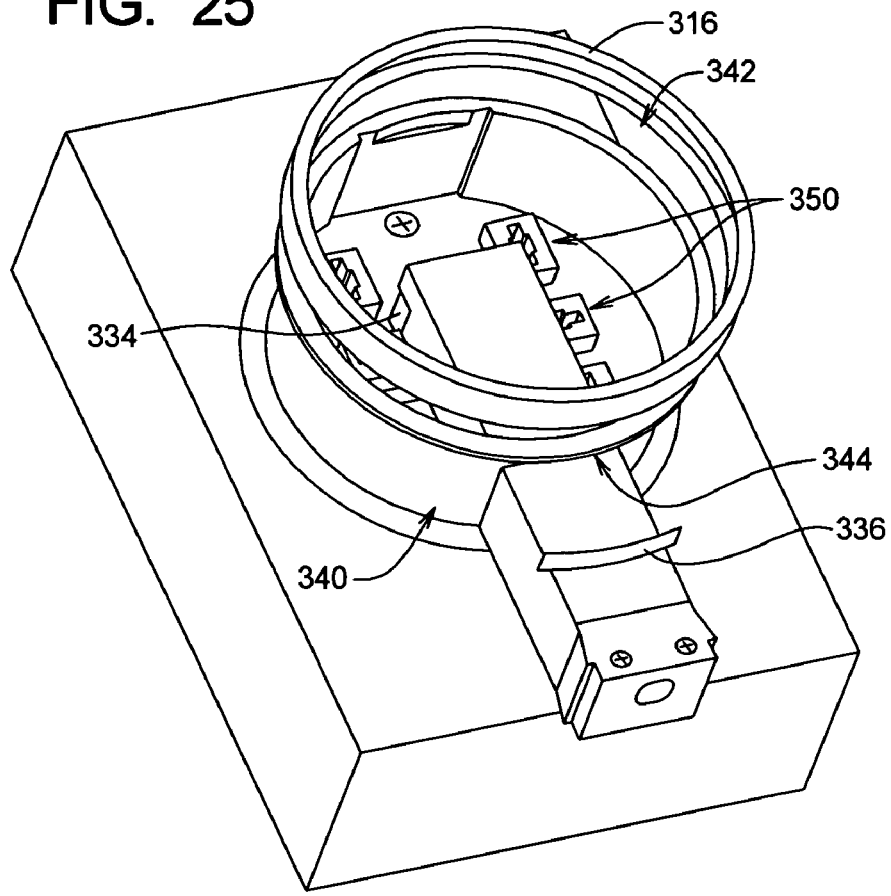
FIG. 25 is a perspective view of the meter connection system of FIG. 20 attached to a wall box.
Figure 26:
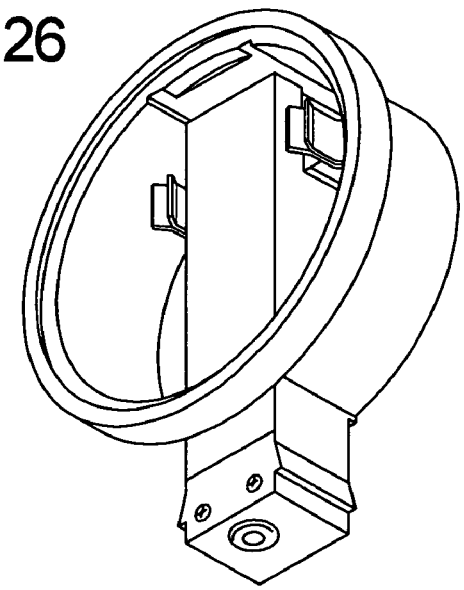
FIG. 26 is a perspective view of the meter connection system of FIG. 20.
Figure 27:
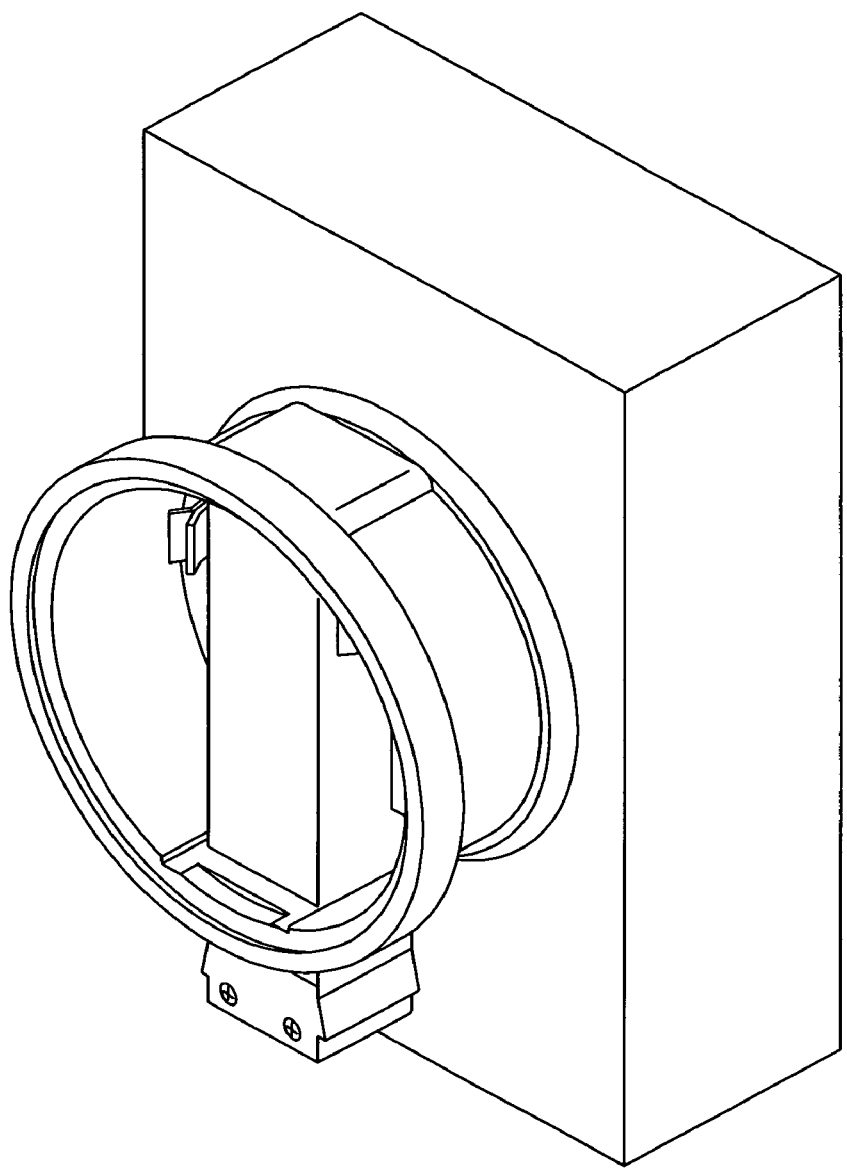
FIG. 27 is a perspective view of the meter connection system of FIG. 20 attached to a wall box.
Figure 28:
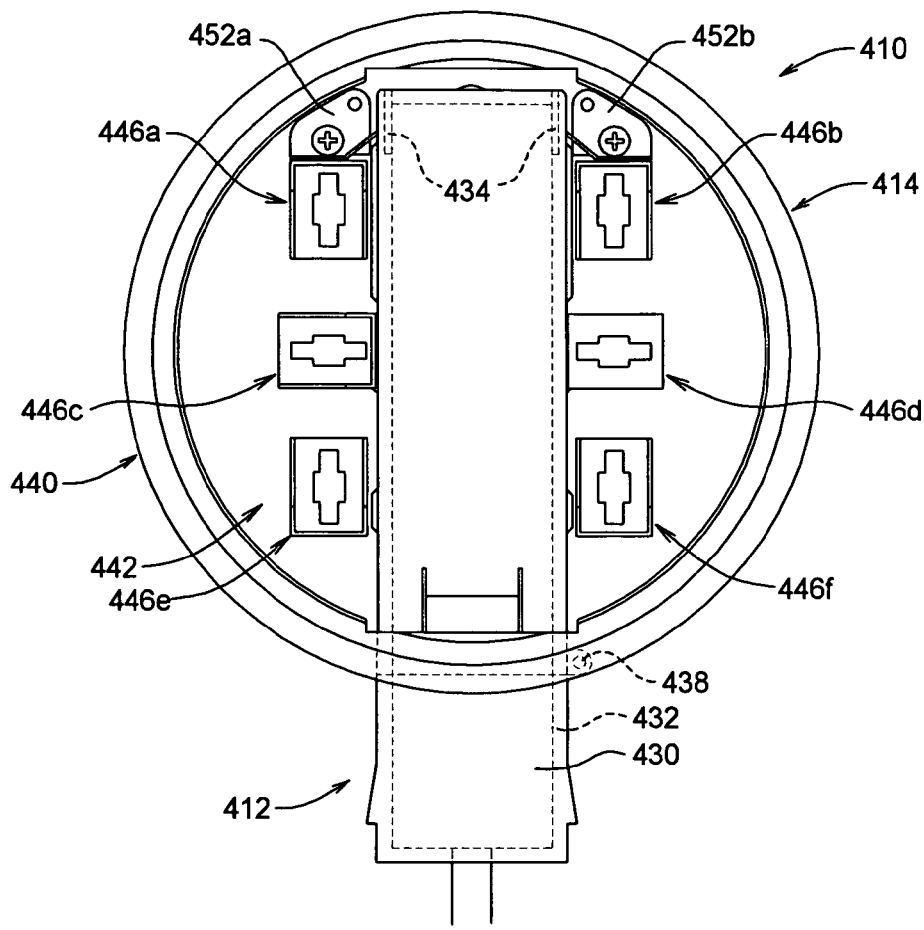
FIG. 28 is a front elevation view of yet another embodiment of a meter connection system of the present invention.

FIGS. 22, 23, and 24 depict an optional guide system 380 that guides the adapter assembly 312 into the engaged position shown in FIGS. 20, 26, and 27. The example guide system 380 comprises a pair of alignment projections 382 formed on the adapter housing 330. Complementary alignment recesses 384 are formed on a boss 386 within the collar housing 340. The projections 382 engage the recesses 384 to guide the adapter assembly 312 into the engaged position.

A lock or other security device may be used to prevent or identify tampering with the lock ring 316. In addition, the lock ring 316 itself may be eliminated as described above.

Referring now to FIGS. 28–33, depicted therein is yet another example of a meter connection system 410 constructed in accordance with, and embodying, the principles of the present invention. As perhaps best shown in FIGS. 28 and 29, the meter connection system 410 comprises an adapter assembly 412, a collar assembly 414, and an optional lock ring 416.

As with the systems 10 and 310 described above, the meter connection system 410 is of particular significance when used with a wall box (not shown) secured to an exterior surface of a building served by a utility company. In addition, the meter connection system 410 is also intended for use with a meter assembly (not shown) such as the meter assembly 24 described above.

The adapter assembly 412 comprises an adapter housing 430. Adapter electronics 432 are arranged within the adapter housing 430. Like the adapter electronics 38 discussed above, the adapter electronics 432 may take different forms depending on the environment in which the connection system 410 is to be used. The adapter assembly 412 further comprises a plurality of contacts 434, a lock projection 436 formed on the adapter housing 430, and a lock opening 438.

The collar assembly 414 comprises a collar housing 440 defining a main opening 442, an adapter opening 444, and a plurality of terminal mounts 446a–f. As shown in FIG. 33A, the example collar assembly 414 is configured to support a plurality of main terminals 450a, 450b, 450e, and 450f and a plurality of secondary terminals 452a and 452b. The main terminals 450a, 450b, 450e, and 450f are supported at predetermined locations by terminal mounts 446a, 446b, 446e, and 446f, respectively. Only the terminal mounts 446 are depicted in FIGS. 28 and 30–32. The secondary terminals 452a and 452b may be supported anywhere within the housing 440, but are supported adjacent to the terminal mounts 446a and 446b in the example collar assembly 414.

In use, the collar assembly 414 is mechanically and electrically connected to a wall box as generally described above. The meter assembly is then mechanically and electrically connected to the collar assembly 414. At this point, a utility or primary power signal may flow normally from the utility side to the user side, and the meter assembly (not shown) will function normally to measure power consumption by the user. Optionally, the lock ring 416 is used to lock the meter assembly onto the collar assembly 414.

If used, the adapter assembly 412 is inserted into the collar housing 440 through the adapter opening 444. At this point the utility or primary power signal may flow to loads within the adapter housing 430 or to loads located remote from the meter connection system 410. Removal of the adapter assembly 412 does not necessarily disrupt power to the user side of the meter assembly.

Figure 29:
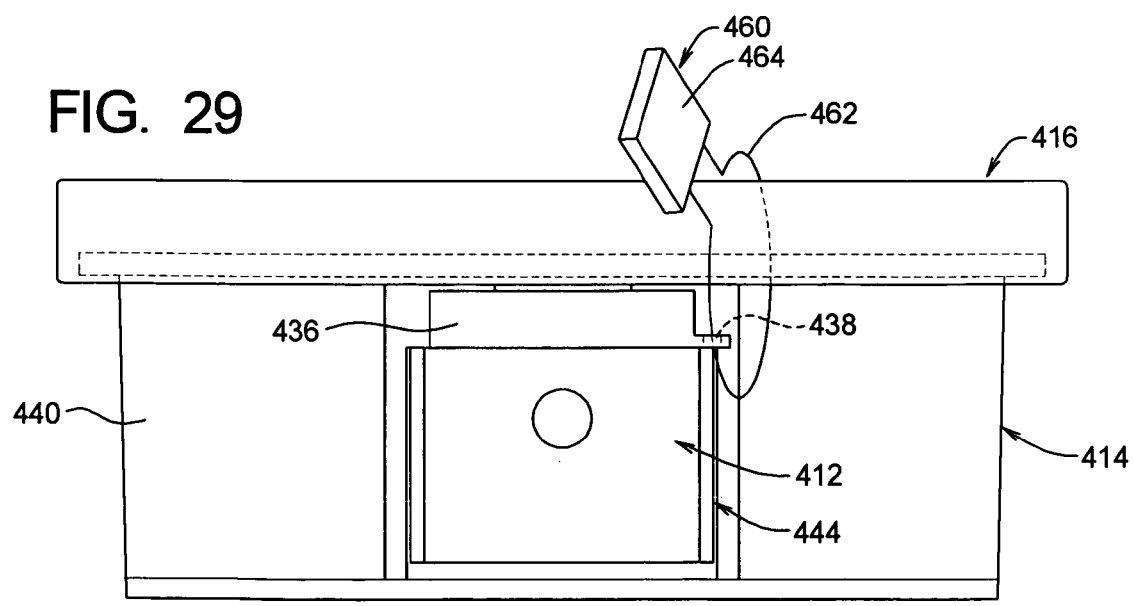
FIG. 29 is a bottom plan view of the meter connection system of FIG. 28.

In the example system 410, the lock ring 416 does not adequately engage the lock projection 436 to prevent removal of the adapter housing 430 through the adapter opening 444 (FIG. 29). The lock opening 438 is formed adjacent to or on the lock projection 436 and is thus also adjacent to the lock ring 416. Accordingly, to inhibit tampering with the adapter assembly 412, an optional tamper seal assembly 460 may be provided.

The tamper seal assembly 460 comprises an elongate portion 462 and a seal portion 464. The example elongate portion 462 takes the form of a metal or plastic wire that extends through the lock opening 438 and the lock ring 416. The seal portion 464 engages the ends of the elongate portion 462 to prevent removal of the elongate portion 462 from the lock opening 438 and lock ring 416.

Tamper seal assemblies such as the example assembly 460 are conventionally used by utilities to detect tampering. Typically, the seal portion 464 may be formed only by the utility company; while a determined person can remove the seal assembly 46 and tamper with the system protected thereby, the utility company is able to detect such tampering and take any necessary remedial action.

Figure 30:
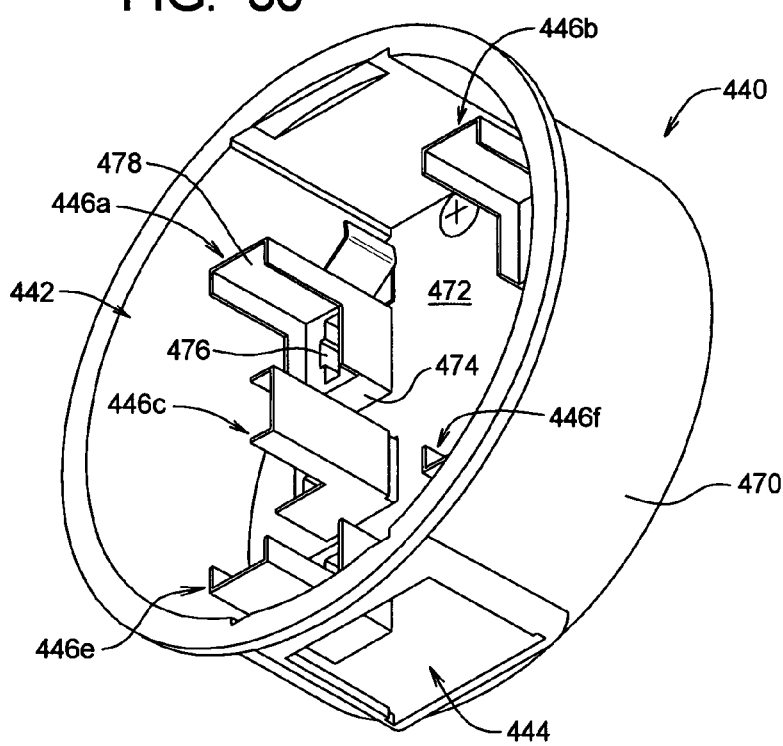
FIG. 30 is a perspective view of an adapter housing of the meter connection system of FIG. 28.

Turning now to FIG. 30, the collar housing 440 is depicted therein in further detail. The collar housing 440 comprises an annular wall 470 and a rear wall 472. As perhaps best shown in FIGS. 30 and 32, the terminal mounts 446 are projections that extend from the rear wall 472. The projections each comprise a base portion 474 through which a terminal opening 476 extends. Extending from each of the base portions 474 is a wall structure 478. The wall structures 478 are configured to guide the meter prongs towards the appropriate one of the terminals 450 and keep the meter prongs away from inappropriate terminals 450.

Figure 31:
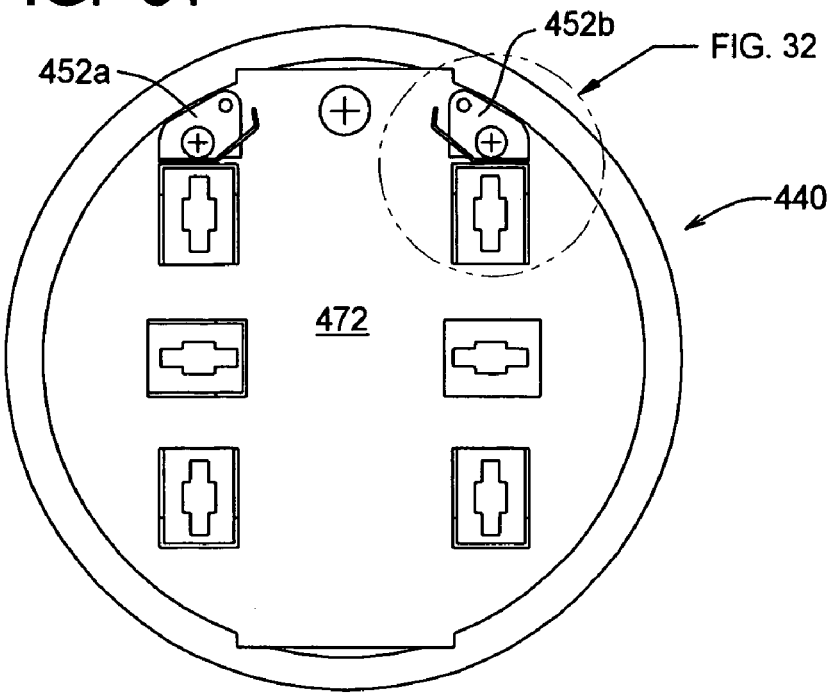
FIG. 31 is a somewhat schematic front elevation view of the adapter assembly of the meter connection system of FIG. 28.
Figure 32:
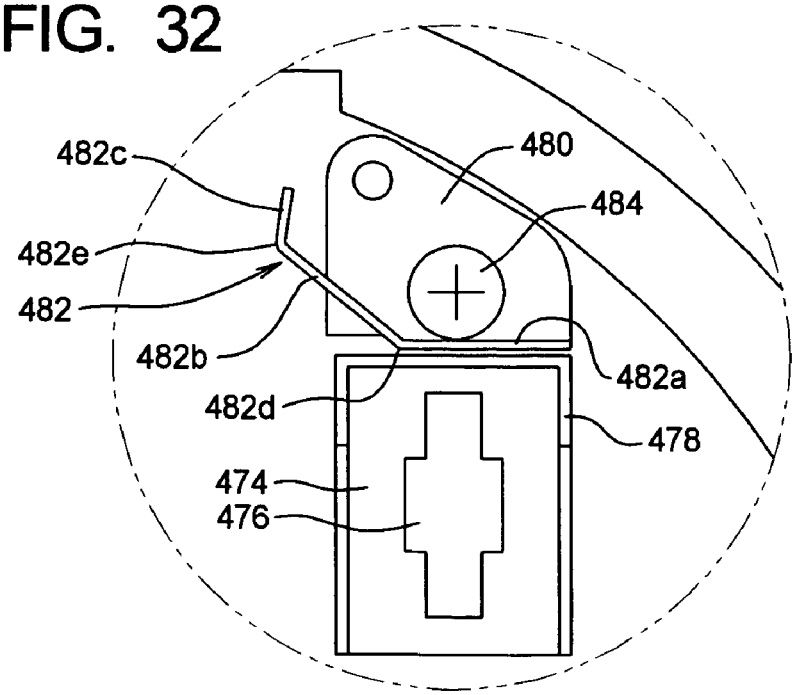
FIG. 32 is a close up of a portion of FIG. 31.
Figure 33A:
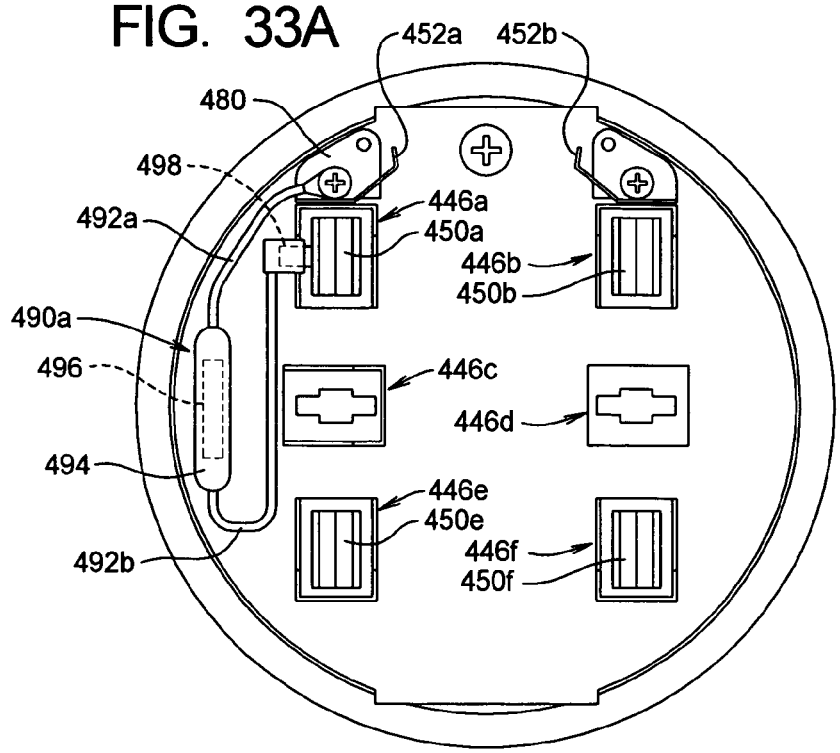
FIG. 33A is a front elevation view of the meter connection system of FIG. 28 illustrating a first wire assembly configuration.

Turning now to FIGS. 31 and 32, the construction of the example secondary terminals 452 will now be described in further detail. The example secondary terminals 452a and 452b are mirror images of each other, and only the secondary terminal 452b will be described in detail.

As shown in FIG. 31, the secondary terminals 452 comprise a mounting plate 480 and a contact plate 482. The mounting plate 480 is secured to the rear wall 472 of the collar housing 440 by a screw 484. The contact plate 482 comprises a proximal portion 482a, an intermediate portion 482b, and a distal portion 482c. The proximal portion 482a is connected to the mounting plate 480. The intermediate portion 482b extends from the proximal portion 482a at a first juncture 482d, while the distal portion 482c extends from the intermediate portion 482b at a second juncture 482e. The secondary terminals 452 are made of a conductive, resilient material such as metal.

In use, the adapter contacts 434 are displaced towards the secondary terminals 452 such that the one of the adapter contacts 434 engage the intermediate portions 482b of the secondary terminals 452. Further displacement of the adapter contacts 434 causes the contact plate 482 to bend or deform at the first juncture 482d, which allows the contact 434 to slide against the second juncture 482e. The resiliency of the contact plate 482 establishes a spring-like biasing force. Because the terminals 452a and 452b are arranged opposite each other, the biasing forces associated therewith hold the second junctures 482e against their respective adapter contacts 434. Electrical contact is thus formed and maintained between the contact plates 482 and the adapter contacts 434.

The example secondary terminals 452 are insulated from the primary terminals 450 in the example system 410. Accordingly, as shown in FIGS. 33, to allow the power flowing through the collar assembly 414 to be applied to the secondary terminals 452, the collar assembly 414 further comprises at least one, and preferably two, wire assemblies 490.

More specifically, FIG. 33A illustrates a pair of wire assemblies 490a of a first type comprising first and second wire segments 492a and 492b connected to a fuse assembly 494. The first wire segments 492a are connected to the secondary contacts 452a and 452b, while the second wire segments 492b are connected to the primary contacts 450a and 450b. Within predefined parameters, a short circuit electrical connection is formed between the primary contacts 450 and the secondary contacts 452, respectively. Outside of predefined parameters, such as an over-current situation, a fuse 496 within the fuse assembly 494 blows, thereby disconnecting the secondary contact 452 associated with the blown fuse from the primary contact 450 associated therewith.

Figure 33B:
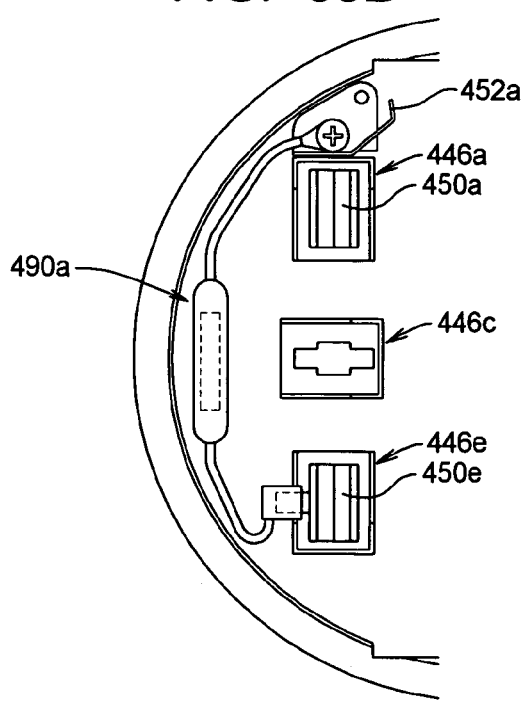
FIG. 33B is a front elevation view of the meter connection system of FIG. 28 illustrating a second wire assembly configuration.

In addition, as shown in FIG. 33B, the wire assemblies 490a of the first type may be connected between the secondary contacts 452a and 452b and the primary contacts 450e and 450f, respectively. The use of the wire assemblies thus allows the installer to select whether the secondary contacts 452 are connected before or after the meter assembly. The power consumed by the adapter electronics 432 thus can be paid for by the utility or charged to the consumer.

Figure 33C:
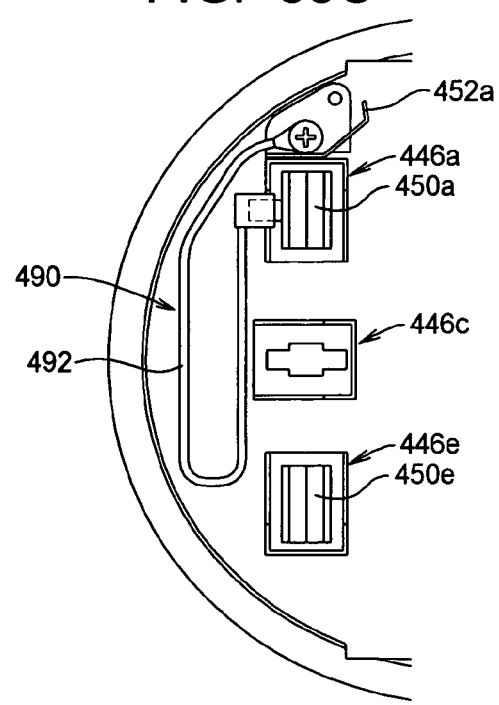
FIG. 33C is a front elevation view of the meter connection system of FIG. 28 illustrating a third wire assembly configuration.

Referring now to FIG. 33C, depicted therein is a wire assembly 90b of a second type. The wire assembly 90b does not contain a fuse assembly, but instead simply comprises a wire segment 492 that forms a short circuit electrical connection between the secondary contacts 452 and the primary contacts 450.

Given the foregoing, one of ordinary skill in the art will understand that the present invention may be embodied in forms other than those described above.

What is claimed is:

1. A connection system for allowing access to a primary power signal flowing through a utility meter having a wall box defining box terminals and a meter assembly defining meter prongs adapted to engage the box terminals, the connection system comprising:
　　a collar assembly comprising
　　　　a collar housing adapted to engage the wall box and the meter assembly,
　　　　a plurality of main terminals supported by the collar housing such some of the main terminals engage the box terminals and some of the main terminals engage the meter prongs to allow the primary power signal to flow between the box terminals and the meter prongs, and
a plurality of secondary terminals supported by the collar housing, where the secondary terminals are each electrically connected to at least one of the main terminals such that the primary power signal is present at the secondary terminals;
an adapter assembly comprising
an adapter housing sized and dimensioned to be arranged in an engaged position relative to the collar housing,
a plurality of adapter contacts, where the adapter contacts engage the secondary contacts when the adapter housing is in the engaged position, and
a lock projection extending from the adapter housing;
a lock ring for selectively securing the meter assembly onto the collar assembly, where the lock projection is arranged such that the lock ring inhibits movement of the adapter housing out of the engaged position; and
adapter electronics contained within the adapter housing, where the adapter electronics are electrically connected to the adapter contacts.

2. A connection system as recited in claim 1, in which:
the collar assembly defines an adapter opening; and
the adapter housing extends at least partly through the adapter opening in the collar housing when the adapter housing is in the engaged position.

3. A connection system as recited in claim 1, further comprising means for inhibiting unauthorized removal of the adapter assembly from the engaged position.

4. A connection system as recited in claim 1, further comprising a lock ring for locking the meter assembly onto the collar assembly to inhibit tampering with the meter assembly.

5. A connection system as recited in claim 4, in which a lock projection extends from the adapter housing, where the lock projection engages the lock ring to inhibit tampering with the adapter housing.

6. A connection system as recited in claim 1, further comprising a guide system for guiding the adapter housing into the engaged position.

7. A connection system as recited in claim 6, in which the guide system comprises an alignment projection formed on one of the collar housing and the adapter housing and an alignment groove formed on the other of the collar housing and the adapter housing.

8. A connection system as recited in claim 1, further comprising an adapter cable electrically connected between the adapter electronics and a remote module.

9. A connection system as recited in claim 1, in which the adapter electronics generates a modified signal based on the primary power signal.

10. A connection system as recited in claim 9, in which:
the primary power signal is an alternating current signal; and
the modified signal is a direct current signal.

11. A connection systems as recited in claim 9, in which the modified signal is an uninterrupted power signal.

12. A connection system as recited in claim 1, in which the adapter electronics alter the flow of the primary power signal between the box terminals and the meter prongs when the primary power signal is not within predetermined parameters.

13. A connection system as recited in claim 12, in which the adapter electronics take the form of a surge protector.

14. A connection system as recited in claim 1, in which an access opening is formed in the adapter housing, where access to the access opening is obstructed by the wall box when the adapter housing is in the engaged position.

15. A connection system as recited in claim 14, in which the adapter assembly further comprises:
a cover member for covering the access opening; and
at least one screw for securing the cover member to the adapter housing, where
the at least one screw is substantially inaccessible when the adapter housing is in the engaged position.

16. A method of accessing a primary power signal flowing through a utility meter having a wall box defining box terminals and a meter assembly defining meter prongs adapted to engage the box terminals, the method comprising the steps of:
providing a collar housing adapted to engage the wall box and the meter assembly;
supporting a plurality of collar prongs on the collar housing;
supporting a plurality of main terminals on the collar housing;
supporting a plurality of secondary terminals on the collar housing, where
the secondary terminals each comprise a resilient contact plate, and
the secondary terminals are arranged in at least one pair, with the contact plates of the pair of secondary terminals oppose each other;
electrically connecting each of the main terminals to at least one of the collar prongs such that the primary power signal is present at the main terminals;
electrically connecting each of the secondary terminals to at least one of the main terminals such that the primary power signal is present at the secondary terminals;
arranging the collar housing between the wall box and the meter assembly such that such some of the collar prongs engage the box terminals and some of the meter prongs engage the some of the main terminals to allow the primary power signal to flow between the box terminals and the meter prongs;
providing an adapter housing;
mounting a plurality of adapter contacts on the adapter housing, where the adapter contacts are arranged in at least one pair, with the pair of adapter contacts arranged on opposite surfaces of the adapter housing;
containing adapter electronics within the adapter housing;
electrically connecting the adapter electronics to the adapter contacts; and
placing the adapter housing in an engaged position relative to the collar housing such that
the adapter contacts each engage and resiliently deform the contact plates of one of the secondary contacts, and
the primary power signal is applied to the adapter electronics.

17. A connection system for allowing access to a primary power signal flowing through a utility meter having a wall box defining box terminals and a meter assembly defining meter prongs adapted to engage the box terminals, the connection system comprising:
a collar assembly comprising
a collar housing defining an adapter opening, where the collar housing is adapted to engage the wall box and the meter assembly,
a plurality of main terminals supported by the collar housing such some of the main terminals engage the box terminals and some of the main terminals engage the meter prongs to allow the primary power signal to flow between the box terminals and the meter prongs, and a plurality of secondary terminals supported by the collar housing, where the secondary terminals are each electrically connected to at least one of the main terminals such that the primary power signal is present at the secondary terminals;

an adapter assembly comprising an adapter housing sized and dimensioned to be inserted at least partially through the adapter opening in an engaged position relative to the collar housing, a plurality of adapter contacts, where the adapter contacts engage the secondary contacts when the adapter housing is in the engaged position;

a lock projection extending from the adapter housing;

a lock ring for selectively securing the meter assembly onto the collar assembly, where the lock projection is arranged such that the lock ring inhibits movement of the adapter housing out of the engaged position; and adapter electronics contained within the adapter housing, where the adapter electronics are electrically connected to the adapter contacts.

18. A connection system as recited in claim 17, further comprising means for inhibiting unauthorized removal of the adapter assembly from the engaged position.

19. A connection system as recited in claim 17, further comprising a guide system for guiding the adapter housing into the engaged position.

20. A connection system as recited in claim 17, further comprising an adapter cable electrically connected between the adapter electronics and a remote module.

21. A connection system as recited in claim 17, in which the adapter electronics maintain the primary power signal within predetermined parameters.

22. A connection system as recited in claim 17, in which the adapter electronics generate a secondary signal based on the primary power signal, where connection system further comprises an adapter cable for transmitting the secondary signal to a remote module.

23. A connection system as recited in claim 22, in which the remote module is located outside of a subscriber's residence.

24. A connection system as recited in claim 22, in which the remote module is located within a subscriber's residence.

25. A connection system as recited in claim 17, in which the adapter electronics generate a secondary power signal based on the primary power signal.

26. A connection system as recited in claim 25, in which the secondary power signal is applied to an uninterruptible power supply module.

27. A connection system as recited in claim 17, in which the adapter electronics allow a cogeneration module to connect to primary power lines.

28. A connection system as recited in 27, further comprising a second meter assembly for measuring power generated by the cogeneration power system.

29. A connection system as recited in claim 17, in which the adapter electronics generate a secondary signal based on the primary power signal, where the secondary signal is transmitted to a remote module using a wireless transmission system.

* * * * *